US012038639B2

(12) United States Patent
Oh et al.

(10) Patent No.: US 12,038,639 B2
(45) Date of Patent: Jul. 16, 2024

(54) DISPLAY DEVICE AND METHOD OF MANUFACTURING THE SAME

(71) Applicant: Samsung Display Co., Ltd., Yongin-si (KR)

(72) Inventors: Myong-Soo Oh, Asan-si (KR); Doo San Park, Asan-si (KR); Hyun Chul Jin, Cheonan-si (KR); Seong Ho Choi, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 149 days.

(21) Appl. No.: 17/465,737

(22) Filed: Sep. 2, 2021

(65) Prior Publication Data

US 2022/0107525 A1   Apr. 7, 2022

(30) Foreign Application Priority Data

Oct. 6, 2020   (KR) ........................ 10-2020-0128764

(51) Int. Cl.
*G02F 1/1333*   (2006.01)
*G02F 1/1345*   (2006.01)
*H05K 1/02*   (2006.01)
*H10K 59/12*   (2023.01)
*H10K 59/131*   (2023.01)
*H10K 59/88*   (2023.01)

(52) U.S. Cl.
CPC .... *G02F 1/133354* (2021.01); *G02F 1/13458* (2013.01); *H05K 1/028* (2013.01); *H05K 2201/10106* (2013.01); *H05K 2201/10136* (2013.01); *H10K 59/1201* (2023.02); *H10K 59/131* (2023.02); *H10K 59/88* (2023.02)

(58) Field of Classification Search
CPC ....................................... G02F 1/13452–13458
See application file for complete search history.

(56) References Cited

U.S. PATENT DOCUMENTS

| | | |
|---|---|---|
| 8,035,238 B2 | 10/2011 | Kim et al. |
| 8,520,376 B2 | 8/2013 | Chang et al. |
| 10,651,260 B2 | 5/2020 | Lee et al. |
| 2008/0119061 A1 | 5/2008 | Hwang et al. |
| 2019/0067406 A1* | 2/2019 | Lee ..................... H01L 27/1262 |
| 2019/0164901 A1 | 5/2019 | Liu et al. |

FOREIGN PATENT DOCUMENTS

| | | |
|---|---|---|
| KR | 10-2007-0117110 | 12/2007 |
| KR | 10-2008-0046021 | 5/2008 |
| KR | 10-1603228 | 3/2016 |
| KR | 10-2019-0021525 | 3/2019 |

* cited by examiner

*Primary Examiner* — Dung T Nguyen
(74) *Attorney, Agent, or Firm* — CANTOR COLBURN LLP

(57) ABSTRACT

A display device includes: a display panel including a display area and a non-display area; a flexible printed circuit board overlapping and attached to the display panel; a pair of first alignment indicia disposed in the non-display area; a pair of second alignment indicia adjacent to the first alignment indicia; a pair of third alignment indicia disposed on the flexible printed circuit board.

20 Claims, 12 Drawing Sheets

(A)

(B)

(C)

(D)

(A)

(B)

(C)

(D)

DISPLAY DEVICE AND METHOD OF MANUFACTURING THE SAME

CROSS-REFERENCE TO RELATED APPLICATION

This application claims priority from and the benefit of Korean Patent Application No. 10-2020-0128764 filed on Oct. 6, 2020, which is hereby incorporated by reference for all purposes as if fully set forth herein.

BACKGROUND

Field

Implementations of the invention relate generally to a display device, and more specifically to a display device including one or more printed circuit boards and a method of manufacturing the same.

Discussion of the Background

Currently, various types of display devices are used as display devices, and is representatively, there are a liquid crystal display (LCD) and an organic light emitting diode (OLED) display.

The liquid crystal display is a display device that includes a backlight unit, and blocks or transmits light emitted from the backlight unit to display an image. On the other hand, the organic light-emitting display device is a display device that has recently attracted attention and has a self-luminous characteristic, and does not require a separate light source, unlike a liquid crystal display device.

The display devices are manufactured in various sizes, and mobile phones are representative of relatively small-sized display devices, and televisions and monitors are representative of relatively large-sized display devices.

Large-sized display devices are becoming very large in size. The largest display device sold in the past was in the 50-inch range, but now many display devices over a 70-inch range are sold, and very large-sized display devices in the 100-inch range are also being distributed on the market. In addition, since the resolution of display device is gradually being developed to high resolution, the size of the wires formed in the display device is gradually decreasing.

The display device includes a plurality of pixels, and a driver for driving the plurality of pixels. Such a driver receives an external signal from and external source, and changes it into a driving signal that is suitable to apply to the plurality of pixels.

The signals generated by the driver and/or the external source are transmitted through a flexible printed circuit board to a display panel including the plurality of pixels.

The above information disclosed in this Background section is only for understanding of the background of the inventive concepts, and, therefore, it may contain information that does not constitute prior art.

SUMMARY

Applicant realized that there are problems that occur with conventional alignments techniques used to connect flexible printed circuit boards to their display panels during manufacture that can adversely affect the performance of and create defects in the manufactured display panel, especially in high resolution displays.

Display devices constructed according to principles and illustrative implementations of the invention and methods of manufacturing the same are capable of aligning flexible printed circuit boards to the display panels without creating significant defects. For example, the flexible printed circuit board may include a pair of first alignment marks adjacent to opposite sides of the flexible printed circuit board, and the display panel may include at least one pair of second alignment marks. The flexible printed circuit board may be aligned with the display panel based on the distance between the first alignment mark and the second alignment mark at each of the opposite sides of the flexible printed circuit board. Since the distance is relatively short, alignment between the flexible printed circuit board and the display panel based on the distance may ensure relatively high reliability of the correct alignment to minimize defects, such as disconnection between pads of the flexible printed circuit board and the display panel.

In case of the display device including a relatively large size of display panel and a plurality of flexible printed circuit boards attached to the display panel, the plurality of flexible printed circuit boards each may be aligned to the display panel with relatively high reliability by using the relatively short distance techniques disclosed herein. For example, a plurality of pressing portions may be used to attach the plurality of flexible printed circuit boards to the display panel respectively, and each of the pressing portions may use a relatively short distance between the first alignment mark and the second alignment mark at each of the opposite sides of a corresponding flexible printed circuit board to align the corresponding flexible printed circuit board to the display panel. Given that errors and/or differences between the relatively short distances measured by the plurality of pressing portions may be relatively low, the plurality of pressing portions may align the plurality of flexible printed circuit boards to the display panel with relatively high reliability, thereby eliminating or minimizing the occurrence of misalignment between the plurality of flexible printed circuit boards and the display panel.

Additional features of the inventive concepts will be set forth in the description which follows, and in part will be apparent from the description, or may be learned by practice of the inventive concepts.

According to one aspect of the invention, a display device includes: a display panel including a display area and a non-display area; a flexible printed circuit board overlapping and attached to the display panel; a pair of first alignment indicia disposed in the non-display area; a pair of second alignment indicia adjacent to the first alignment indicia; and a pair of third alignment indicia disposed on the flexible printed circuit board.

The each of the pairs of first, second and third indicia each comprise pairs of alignment marks, with one of the first alignment marks, one of the second alignment marks, and one of the third alignment marks may be disposed adjacent to a first side of the flexible printed circuit board, and the other one of the first alignment marks, the other one of the second alignment marks, and the other one of the third alignment marks may be disposed adjacent to a second side of the flexible printed circuit board opposing the first side.

Each of the third alignment indicia may be positioned between one of the first alignment indicia and one of the second alignment indicia in a first direction, the first direction is an X-axis direction, and a distance between the pair of first alignment marks in the X-axis direction may be longer than a distance between the pair of second alignment marks in the X-axis direction.

Each of the third alignment marks may be positioned between one of the first alignment marks and one of the second alignment marks in the X-axis direction in a region corresponding to each of the first and second sides.

Each of the positions of the third alignment marks, the first alignment marks, and the second alignment marks may be defined as a center of each alignment mark in the X-axis direction.

The second alignment marks may be disposed in the non-display area, and the first alignment marks may be positioned closer to one side of the display panel than the pair of second alignment marks, the one side of the display panel overlapping the flexible printed circuit board.

Each of the positions of the first alignment marks and the second alignment marks may be defined as a distance from the one side of the display panel in a Y-axis direction generally perpendicular to the X-axis direction.

The flexible printed circuit board may be aligned to the display panel in the X-axis direction based on the following Equation 1: [Equation 1] (X5−X1)/[(X2−X1)/(DV)]+(X3−X6)/[(X3−X4)/(DV)]=Target Value ("TV"), where X1 and X3 are positions of centers of the first alignment marks in the X-axis direction, respectively, X2 and X4 are positions of centers of the second alignment marks in the X-axis direction, respectively, X5 and X6 are positions of centers of the third alignment marks in the X-axis direction, respectively, and DV is a design value of a distance between the center of one of the first alignment marks and the center of one of the second alignment marks in the X-axis direction in a region corresponding to each of the first and second sides.

In Equation 1, (X5−X1)/[(X2−X1)/(DV)] may be calculated with respect to one of the first alignment marks, one of the second alignment marks, and one of the third alignment marks, which are adjacent to the first side of the flexible printed circuit board, and (X3−X6)/[(X3−X4)/(DV)] may be calculated with respect to the other one of the first alignment marks, the other one of the second alignment marks, and the other one of the third alignment marks, which are adjacent to the second side of the flexible printed circuit board.

In Equation 1, the design value may be in a range of about 5 μm to about 2000 μm.

The display panel may further include a plurality of first pads inclined to a Y-axis direction generally perpendicular to the X-axis direction and facing each other, and the flexible printed circuit board may further include a plurality of second pads inclined relative to the Y-axis direction and facing each other.

The plurality of first pads of the display panel and the plurality of second pads of the flexible printed circuit board may be respectively inclined at an angle of about 1 degree to about 15 degrees with respect to the Y-axis direction.

A portion of the flexible printed circuit board overlapping the display panel may have a first length in the Y-axis direction, the first length being determined depending on a second length of the flexible printed circuit board in the X-axis direction.

According to another aspect of the invention, a method of manufacturing a display device having a display panel and a flexible printed circuit board, the display panel having a pair of first alignment marks and a pair of second alignment marks adjacent to the first alignment mark in a non-display area and the flexible printed circuit board having a pair of third alignment marks, includes steps of: aligning the flexible printed circuit board to the display panel in an X-axis direction based on the value of Equation 1: [Equation 1] (X5−X1)/[(X2−X1)/(DV)]+(X3−X6)/[(X3−X4)/(DV)]=Target Value ("TV"), where X1 and X3 are positions of centers of the first alignment marks in the X-axis direction, respectively, X2 and X4 are positions of centers of the second alignment marks in the X-axis direction, respectively, X5 and X6 are positions of centers of the third alignment marks in the X-axis direction, respectively, and DV is a design value of a distance between the center of one of the first alignment marks and the center of one of the second alignment marks in the X-axis direction.

In Equation 1, (X5−X1)/[(X2−X1)/(DV)] may be calculated with respect to one of the first alignment marks, one of the second alignment marks, and one of the third alignment marks, which are adjacent to a left side of the flexible printed circuit board, and (X3−X6)/[(X3−X4)/(DV)] may be calculated with respect to the other one of the first alignment marks, the other one of the second alignment marks, and the other one of the third alignment marks, which are adjacent to a right side of the flexible printed circuit board.

In Equation 1, the design value may be in a range of about 5 μm to about 2000 μm.

The method may further include steps of: measuring a first length of the flexible printed circuit board in the X-axis direction; determining a second length of a portion of the flexible printed circuit board to overlap the display panel in a Y-axis direction that is generally perpendicular to the X-axis direction depending on the first length; and aligning the flexible printed circuit board to the display panel in the Y-axis direction by moving the flexible printed circuit board in the Y-axis direction depending on the second length.

The display panel may further include a plurality of first pads inclined to the Y-axis direction and facing each other, and the flexible printed circuit board may further include a plurality of second pads inclined relative to the Y-axis direction and facing each other.

The plurality of first pads of the display panel and the plurality of second pads of the flexible printed circuit board may be respectively inclined at an angle of about 1 degree to about 15 degrees with respect to the Y-axis direction.

The method may further include the step of: pressing the flexible printed circuit board and the display panel together after aligning the flexible printed circuit board to the display panel in the X-axis direction and the Y-axis direction.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

Figure 1:
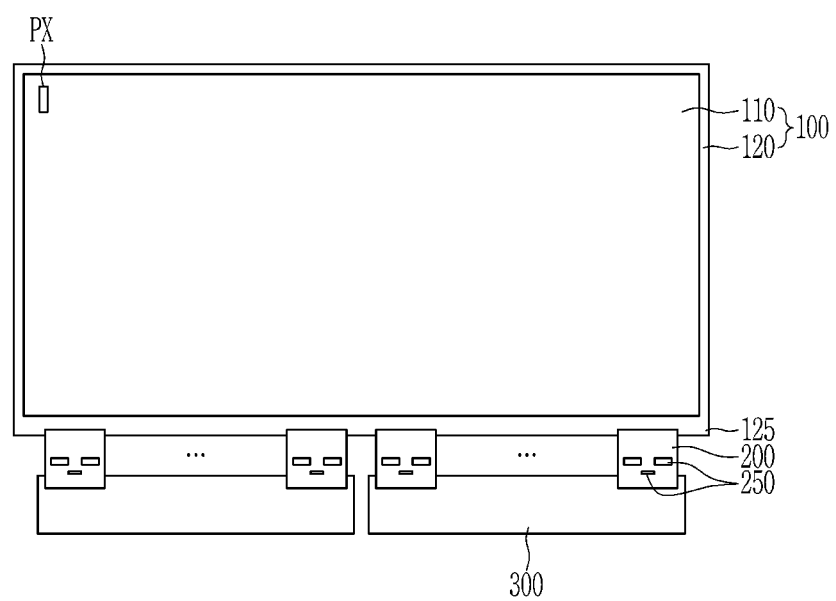
FIG. 1 is a plan view of an embodiment of a display device constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a plan view of an embodiment of a display device constructed according to the principles of the invention.

Referring to FIG. 1, a display device may include a display panel 100, at least one flexible printed circuit board 200, at least one printed circuit board 300, and at least one driving chip 250.

The display panel 100 includes a display area 110 where a plurality of pixels PX are formed on a substrate that is formed of glass and the like, and a non-display area 120 that surrounds the display area 110.

The display panel 100 may be a liquid crystal display panel including liquid crystal, or a light emitting display panel including a light emitting element. In addition, the display panel 100 may be a medium or large sized display panel.

The plurality of pixels PX included in the display panel 100 may be controlled by various control signals including a scan signal and a data voltage, and may receive a constant power voltage.

In the liquid crystal panel, the plurality of pixels PX receives the data voltage and the scan signal. The data voltage applied to the pixel PX forms an electric field together with a common voltage, and the direction in which the liquid crystal molecules are arranged is determined according to the electric field. In case of the liquid crystal panel, a backlight unit is further included, and light provided from the light unit is provided with a phase difference according to an alignment direction of the liquid crystal molecules such that luminance is expressed while adjusting a ratof blocking by a polarizer.

The light emitting display panel may be an organic light emitting display panel including an organic emission layer. In the organic light emitting panel, the plurality of pixels PX receive the data voltage and at least one scan signal, and may also receive a driving voltage, which is a power voltage, and a driving low voltage. In addition, the pixels PX may additionally receive a light emitting signal. An output current of a driving transistor is determined based on the data voltage in the organic light emitting panel, and light is emitted as the output current flows through an organic light emitting diode. Luminance of the light emitted from the organic light emitting diode is determined according to intensity of the current flowing through the organic light emitting diode.

Wires (or signal lines) connected to the pixels PX and a driver (e.g., a scan driver) to control the pixels PX through at least some of the wires may be disposed in the non-display area 120. In an embodiment, the driver may be formed in the same manufacturing process as that of forming the pixels PX. The non-display area 120 may have a wider width than the display area 110, and may further include a pad region 125 to which the flexible printed circuit board 200 is attached.

The display panel 100 includes a scan driver that generates a scan signal. The scan driver may be disposed in the non-display area 120, and may be formed through the same process as that for forming the plurality of pixels PX.

In case where the display panel 100 is an organic light emitting display device, the display panel 100 may further include a separate driver to provide the light emitting signal. The driver providing the light emitting signal may be formed through the same process as that for forming the plurality of pixels PX in some area of the non-display area 120.

The driving chip 250 to apply various signals, voltages, and/or current, such as the data voltage and the driving signal, may be disposed on the flexible printed circuit board 200, and the flexible printed circuit board 200 may be attached to the pad region 125 of the display panel 100 such that the signals, voltages, and/or current are transmitted to elements of the display panel 100 such as the pixels PX. In FIG. 1, three driving chips 250 are attached to one flexible printed circuit board 200, and sizes and positions of the driving chips 250 may be different from each other. The number of driving chips 250 may be one or more and may be located in the flexible printed circuit board 200, and the number of driving chips 250 is determined based on the number of wires (or signal lines) controlled by a single driving chip 250. As the resolution of the display device increases, the number of driving chips 250 attached to one flexible printed circuit board 200 tends to increase.

A printed circuit board 300 is attached to the other side of the flexible printed circuit board 200. A driver such as an additional timing controller may be formed in the printed circuit board 300.

The printed circuit board 300 serves to transmit an external input image signal to the driving chip 250, and may also serve to transmit a basic voltage level used in the pixel PX.

In FIG. 1, two printed circuit boards 300 are formed, but depending on the particular application, more printed circuit boards 300 may be formed. In addition, an additional flexible printed circuit board that connects an adjacent printed circuit board 300 may be further included. The additional flexible printed circuit board may serve to transmit an external input image signal from one printed circuit board 300 to the other printed circuit board 300.

The number of flexible printed circuit boards 200 attached to the display panel 100 may be increased as the resolution of the display panel 100 is increased, and depending on the particular application, 16 or 24 flexible printed circuit boards 200 may be attached to a single display panel 100.

The display panel 100, the flexible printed circuit board 200, and the printed circuit board 300 are attached to each other by an anisotropic conductive film (ACF) and are thus electrically connected with each other.

An attachment structure of the display panel 100 and the flexible printed circuit board 200 will be described with reference to FIG. 2.

Figure 2:
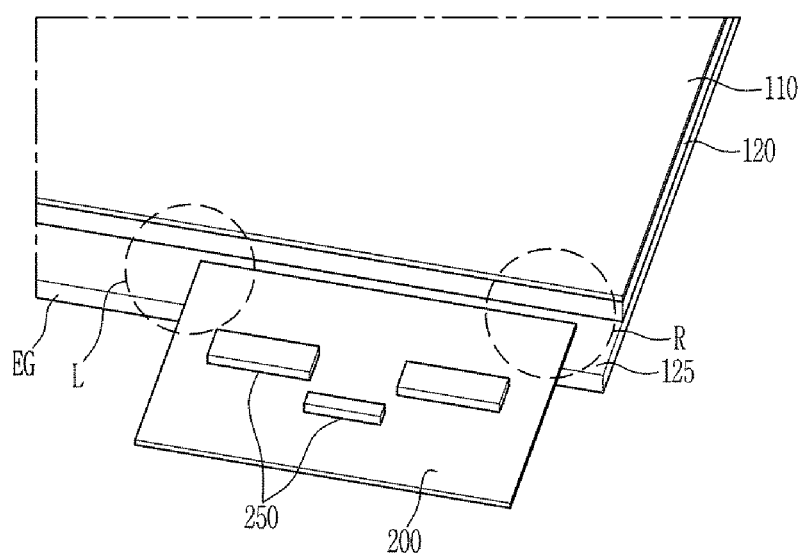
FIG. 2 is an enlarged view of a part of the display device of FIG. 1.

FIG. 2 is an enlarged view of a part of the display device of FIG. 1.

The flexible printed circuit board 200 is attached to the pad region 125 in the non-display area 120 of the display panel 100 by the anisotropic conductive film (ACF). Accordingly, pads disposed on the pad region 125 of the display panel 100 and pads disposed on flexible printed circuit board 200 are attached so that they are electrically connected to each other.

The widths and/or spaces of the wires (or signal lines) and the pads may be reduced as the display panel 100 is developed for high resolution applications to increase the number of the wires and pads in a unit area. In this case, the flexible printed circuit board 200 needs to be aligned and attached to the pad region 125 with a relatively low error range in order to connect the pads of the flexible printed circuit board 200 and the display panel 100 to each other as desired.

Figure 12:
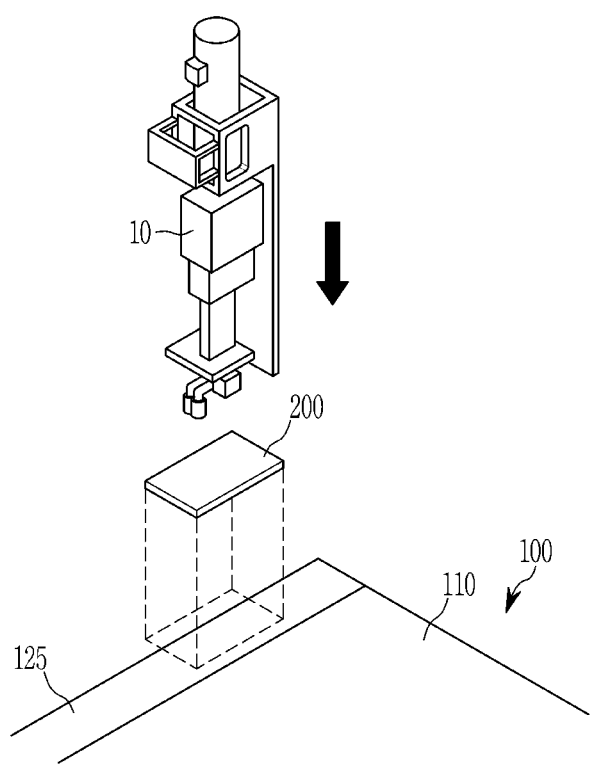
FIG. 12 is a view of an embodiment of an alignment and compression machine to attach a flexible printed circuit board to a display panel.

When attaching each of the flexible printed circuit boards 200 to the display panel 100, alignment and compression machines are used to recognize certain indicia, which may be in the form of alignment marks of the flexible printed circuit boards 200 and the display panel 100 and align the flexible printed circuit boards 200 to the display panel 100 based on the alignment marks. Referring to FIG. 12, a pressing portion 10 may be used to attach the flexible printed circuit board 200. As the number of flexible printed circuit boards 200 increases, the alignment and compression machine may include a plurality of pressing portions so that a plurality of flexible printed circuit boards 200 can be simultaneously attached to the display panel 100. However, the value of the alignment marks measured by each pressing portion may be different, which means that the measured value includes an error. Due to such an error, each of the flexible printed circuit boards 200 may be incorrectly attached to corresponding portions of the display panel 200. Such an error may occur between a plurality of pressing portions within a single alignment and compression machine, and may also occur between a plurality of alignment and compression machines.

If such an error is within a permissible error range, there is no problem due to misalignment. However, as the resolution of the display panel 100 increases, the permissible error range decreases and the error may be out of the permissible error range, which may cause defects, such as disconnection between the pads of the flexible printed circuit boards 200 and the display panel 100.

The error may be relatively large when measuring a relatively long distance such as the length of several tens of mm units, which may be similar to the entire length of the flexible printed circuit board 200. This is because the unit used to align the flexible printed circuit board 200 has a value of tens or hundreds of μm, and thus when measuring a value of mm units, it is relatively inaccurate and thus the measured value may include a relatively large error. The relatively large error may cause misalignment of the flexible printed circuit board 200 and the display panel 100.

In order to prevent such a problem from occurring when measuring a value that is relatively large compared to the unit used in alignment, alignment marks shown in FIG. 3 and FIG. 4 may be used and alignment may be carried out as described with reference to FIG. 6.

Figure 3:
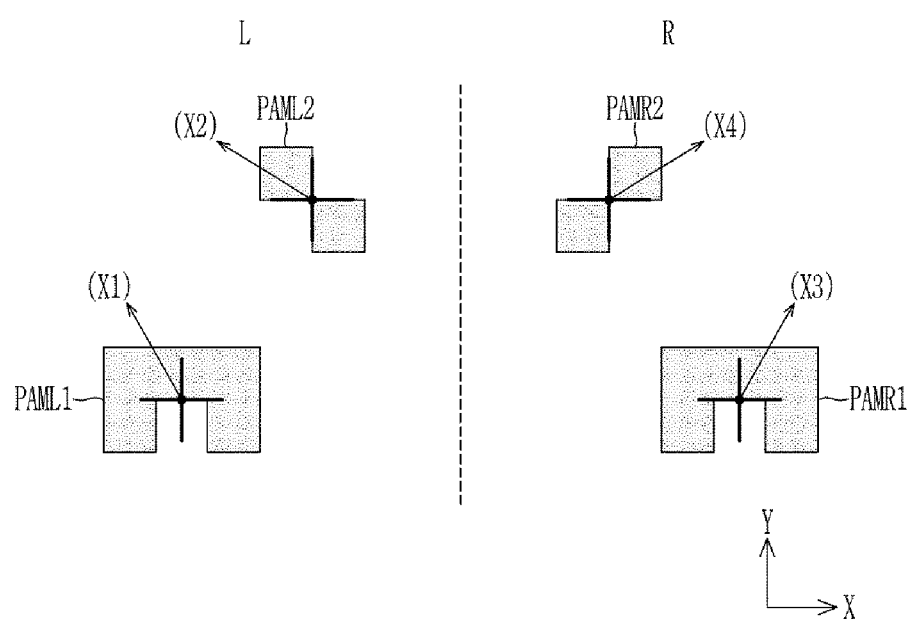
FIG. 3 is a plan view of an embodiment of alignment marks disposed in regions L and R of the display panel of FIG. 2.
Figure 4:
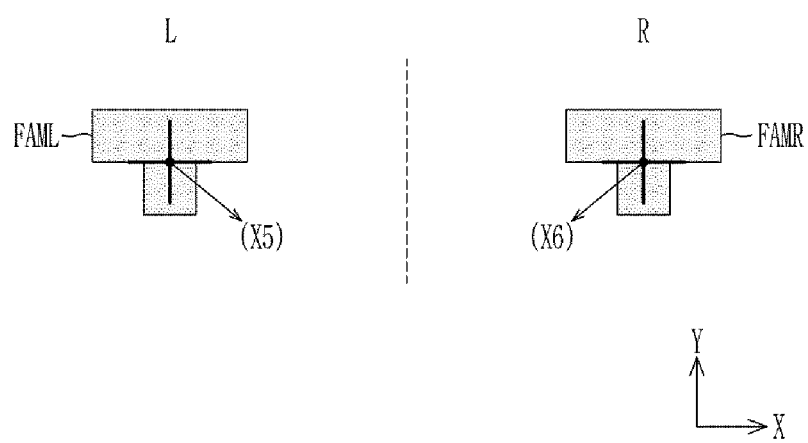
FIG. 4 is a plan view of an embodiment of alignment marks disposed in regions L and R of the flexible printed circuit board of FIG. 2.

Referring to FIG. 3 and FIG. 4, alignment marks formed in first and second regions L and R of each flexible printed circuit board 200 and the corresponding pad region 125 of the display panel 100 will now be described. The first region L corresponds to a left side of the flexible printed circuit board 200 and the second region R corresponds to a right side of the flexible printed circuit board 200 opposing the left side, as shown in FIG. 2.

FIG. 3 is a plan view of an embodiment of alignment marks disposed in regions L and R of the display panel of FIG. 2. FIG. 4 is a plan view of an embodiment of alignment marks disposed in regions L and R of the flexible printed circuit board of FIG. 2.

Referring to FIG. 1 to FIG. 4, the display device includes the display panel 100 that includes a glass substrate including the display area 110 and the non-display area 120, the flexible printed circuit board 200 attached to the display panel 100, a pair of first alignment marks PAML1 and PAMR1 located in the non-display area 120, a pair of second alignment marks PAML2 and PAMR2 that are adjacent to the first alignment marks PAML1 and PAMR1, and a pair of third alignment marks FAML and FAMR located in the flexible printed circuit board 200. The pair of second alignment marks PAML2 and PAMR2 may be disposed in the non-display area 120.

One of the pair of first alignment marks PAML1 and PAMR1, one of the pair of second alignment marks PAML2 and PAMR2, and one of the third alignment marks FAML and FAMR are adjacent to one side of the flexible printed circuit board 200 and disposed in one of the first and second regions L and R, and the other one of the pair of first alignment marks PAML1 and PAMR1, the other one of the pair of second alignment marks PAML2 and PAMR2, and the other one of the third alignment marks FAML and FAMR are adjacent to the other side of the flexible printed circuit board 200 and disposed in the other one of the first and second regions L and R.

The position of each of the pair of third alignment marks FAML and FAMR may be located between positions of one of the first alignment marks PAML1 and PAMR1 and one of the second alignment marks PAML2 and PAMR2 in an X-axis direction (e.g., horizontal direction) in each of the first and second regions L and R.

First, referring to FIG. 3, the alignment marks PAML1, PAMR1, PAML2, and PAMR2 formed in the pad region 125 of the display panel 100 will be described.

In the pad region 125 of the display panel 100, the pair of first alignment marks PAML1 and PAMR1 and the pair of second alignment marks PAML2 and PAMR2 are formed in the first and second regions L and R.

The pair of first alignment marks PAML1 and PAMR1 are positioned relatively outwardly, and the pair of second alignment marks PAML2 and PAMR2 are positioned relatively inwardly. The distance between the pair of first alignment marks PAML1 and PAMR1 in the X-axis direction is longer than the distance between the pair of second alignment marks PAML2 and PAMR2 in the X-axis direction.

The first alignment mark PAML1 disposed outwardly and the second alignment mark PAML2 disposed inwardly may form another pair of alignment marks PAML1 and PAML2 in the first region L. The first alignment mark PAML1 may be positioned closer to an edge EG of the display panel 100 in a Y-axis direction perpendicular to the X-axis direction than the second alignment mark PAML2, and the second alignment mark PAML2 may be positioned closer to the display area 110 in the Y-axis direction. The edge EG may correspond to one of the sides of the display panel 100 overlapping the flexible printed circuit board 200.

Centers X1 and X2 of the pair of alignment marks PAML1 and PAML2 may be automatically recognized based on outer edges of each of the alignment marks PAML1 and PAMRL, and a distance associated with the centers X1 and X2 may be measured to align the flexible printed circuit board 200 to the display panel 100.

The pair of alignment marks PAML1 and PAML2 are formed on the glass substrate, and thus the distance between the pair of alignment marks PAML1 and PAML2 is not changed. In addition, since the pair of alignment marks PAML1 and PAML2 are formed together when the pixel PX is formed, each pattern is formed very precisely. Thus, the horizontal distance between the pair of alignment marks PAML1 and PAML2 may be substantially constant and is not changed. The designed horizontal distance (hereinafter, referred to as the design value) may be used to align the flexible printed circuit board 200 to the display panel 100 to secure relatively high reliability of the alignment, as described below. The design value may be in a range of about 5 μm to about 2000 μm.

The first alignment mark PAMR1 located at an outer side and the second alignment mark PAMR2 located at an inner side may form still another pair of alignment marks in the second region R. The first alignment mark PAMR1 may be disposed closer to the edge EG of the display panel 100 in the Y-axis direction than the second alignment mark PAMR2, and the second alignment mark PAMR2 may be disposed closer to the display area 110 in the Y-axis direction.

Centers X3 and X4 of the pair of alignment marks PAMR1 and PAMR2 may be automatically recognized based on outer edges of each of the alignment marks PAMR1 and PAMR2, and the distance associated with the centers X3 and X4 may be measured to align the flexible printed circuit board 200 to the display panel 100.

The first alignment marks PAML1 and PAMR1 disposed at opposite sides may have substantially the same shape, and the second alignment marks PAML2 and PAMR2 may also have substantially the same shape. In the case where the first alignment marks PAML1 and PAMR1 and the second alignment marks PAML2 and PAMR2 have the different shapes, one of the first alignment marks PAML1 and PAMR1 and one of the second alignment marks PAML2 and PAMR2 positioned adjacent to each other can be easily distinguished by, for example, the alignment and compression machine.

In FIG. 3, a dotted line is illustrated between the pair of alignment marks PAML1 and PAML2 disposed on the first region L and the pair of alignment marks PAMR1 and PAMR2 disposed on the second region R, and this makes it easier to virtually see the position of the center line between them.

Referring to FIG. 4, third alignment marks FAML and FAMR are respectively formed in the first region L and the second region R of the flexible printed circuit board 200.

The flexible printed circuit board 200 may be formed of a deformable material such as plastic or polyimide (PI), and due to the characteristic of the material, the positions of the third alignment marks FAML and FAMR may be changed compared to the alignment marks PAML1, PAMR1, PAML2, and PAMR2 formed on the display panel 100. For example, the flexible printed circuit board 200 may be elongated in one direction (e.g., X-axis direction).

Centers X5 and X6 of the third alignment marks FAML and FAMR of the flexible printed circuit board 200 may be automatically recognized based on outer edges of the respective third alignment marks FAML and FAMR, and the distance associated with the centers X5 and X6 may be measured to align the flexible printed circuit board 200 to the display panel 100.

In FIG. 4, a dotted line is illustrated between the third alignment marks FAML and FAMR respectively disposed on the first region L and the second region R, and this makes it easier to virtually see the position of the center line between them.

Referring to FIG. 3 and FIG. 4, three types of alignment marks have asymmetric structures. The display panel 100 and the flexible printed circuit board 200 have different alignment marks. For example, the display panel 100 may include two pairs of alignment marks PAML1, PAMR1, PAML2, and PAMR2, whereas the flexible printed circuit board 200 may include one pair of alignment marks FAML and FAMR.

Figure 6:
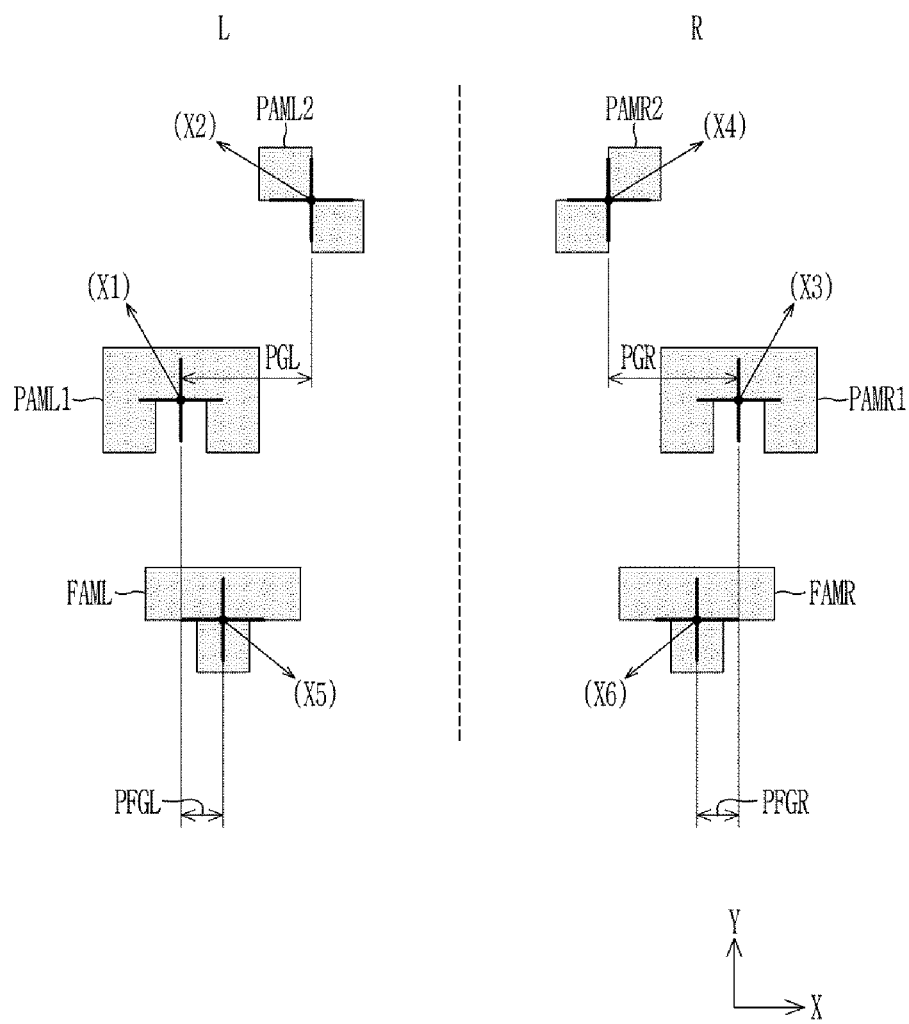

In general, alignment may be performed in a one-to-one correspondence using the same number of alignment marks of each of the display panel 100 and the flexible printed circuit board 200, but in embodiments, as shown in FIG. 6, alignment may be performed using different number of alignment marks of each of the display panel 100 and the flexible printed circuit board 200. For example, the alignment may be performed by using three alignment marks including two (2) alignment marks of the display panel 100 and one (1) alignment mark of the flexible printed circuit board 200 in each of the first and second regions L and R.

The three alignment marks in each of the first and second regions L and R may have different shapes. In this manner, the alignment marks adjacent to each other may be easily distinguished from each other by the alignment and compression machine. However, embodiments are not limited thereto. For example, at least two alignment marks may have the same shape, and the pair of the alignment marks positioned in the first and second regions L and R may have different shapes. Examples of various shapes of the alignment marks will be described with reference to FIG. 10 and FIG. 11.

The display panel 100 and the flexible printed circuit board 200 having different alignment marks as shown in FIG. 3 and FIG. 4 may be aligned and attached to each other using a method described below with reference to FIG. 5 and FIG. 6.

Figure 5:
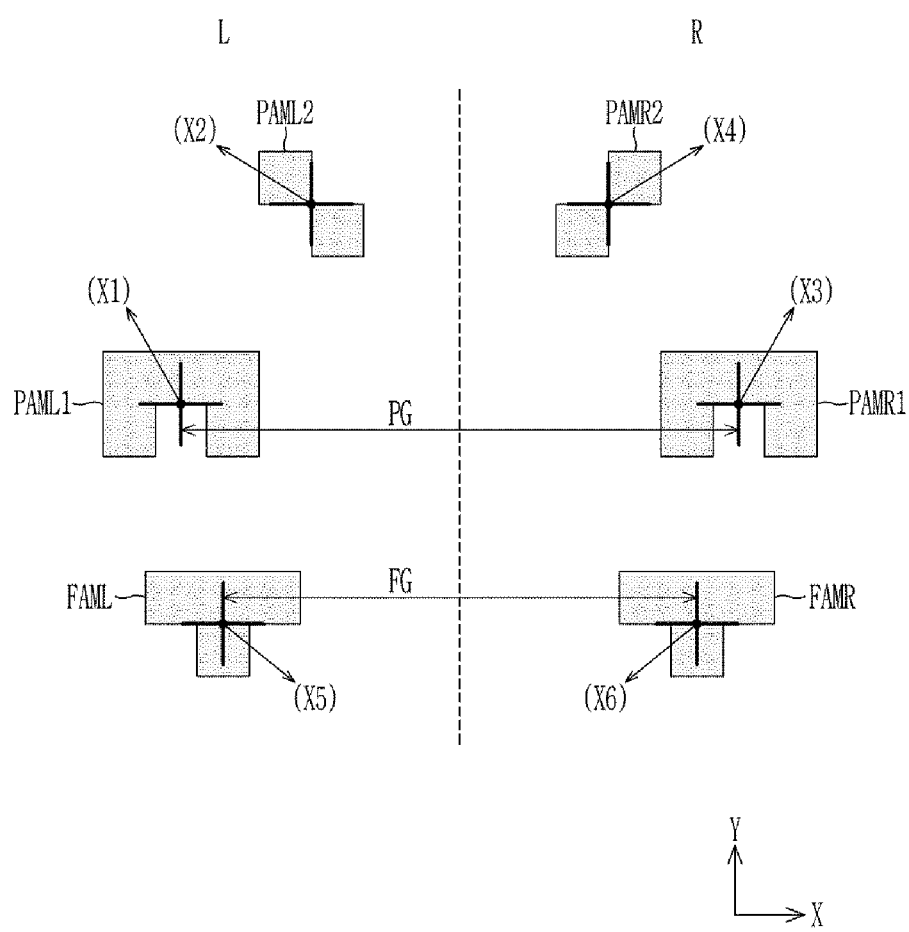
FIG. 5 and FIG. 6 are views of an arrangement of the alignment marks of FIG. 3 and FIG. 4 when the flexible printed circuit board is aligned with the display panel in an X-axis direction.

FIG. 5 and FIG. 6 are views of an arrangement of the alignment marks of FIG. 3 and FIG. 4 when the flexible printed circuit board is aligned with the display panel in an X-axis direction.

First, an example of an alignment method will be described with reference to FIG. 5.

Referring to FIG. 5, the display panel 100 and the flexible printed circuit board 200 may be aligned to each other on the basis of centers of alignment marks disposed in the first and second regions L and R of the display panel 100 and centers of alignment marks disposed in the first and second regions L and R of the flexible printed circuit board 200.

First, a center of the display panel 100 in the X-axis direction is determined by using the first alignment marks PAML1 and PAMR1 disposed in the first and second regions L and R of the display panel 100. For example, a horizontal distance PG (i.e., a distance in the X-axis direction) between the centers X1 and X3 of the first alignment marks PAML1 and PAMR1 is obtained, and the center between the first alignment marks PAML1 and PAMR1 is set as the center of a portion of the display panel 100 to be attached to the flexible printed circuit board 200.

In addition, a horizontal distance FG (i.e., a distance in the X-axis direction) between the centers X5 and X6 of the third alignment marks FAML and FAMR that are disposed in the first and second regions L and R of the flexible printed circuit board 200 is obtained, and then the center between the centers X5 and X6 is set as the center of the flexible printed circuit board 200 in the X-axis direction.

The position of the center of the display panel 100 and the position of the center of the flexible printed circuit board 200 may be aligned to be matched with each other so as to not be biased to one side in the left and right (X-axis direction).

In FIG. 5, the pair of first alignment marks PAML1 and PAMR1 are used to determine the center of the display panel 100, but two pairs of the first alignment marks PAML1 and PAMR1 and the second alignment marks PAML2 and PAMR2 may be used to determine the center of the display panel 100 in the X-axis direction.

In an embodiment, the horizontal distance PG (distance in the X-axis direction) of the first alignment marks PAML1 and PAMR1 may be about 61,000 μm, which is about 61 mm. In addition, a horizontal distance between the center of one of the first alignment marks PAML1 and PAMR1 and the center of one of the second alignment marks PAML2 and PAMR2 in each of the first and second regions R and L may be about 200 μm, and the center of one of the third alignment marks FAML and FAMR may be located between the center of one of the first alignment marks PAML1 and PAMR1 and the center of one of the second alignment marks PAML2 and PAMR2 in each of the first and second regions R and L in the X-axis direction.

Given that the flexible printed circuit board 200 may be moved relative to the display panel 100 by a relatively small amount such as several μm or hundreds of μm, compared to the relatively large horizontal distances PG and FG, which may be tens of mm, a relatively very large error may be introduced with this alignment method.

More specifically, when the distance between alignment marks that are positioned far apart from each other on the left and right as described with reference to FIG. 5, is large, it is difficult to use a measured value for a display panel with a small permissible error range because the measured value is relatively very large, at the level of several tens of mm, and therefore may include a relatively large error. As such, while the flexible printed circuit board 200 may be aligned to the display panel 100 by recognizing the center of the display panel 100 and the center of the flexible printed circuit board 200 in the X-axis direction based on the horizontal distances PG and FG, this method may cause misalignment of the flexible printed circuit board 200 due to the relatively large error. However, the method described above with reference to FIG. 5 does have the advantage of not requiring many measured values, so it is easy to determine the distances. Therefore, if a display panel has a relatively large permissible error range, the method described above with reference to FIG. 5 may be used.

If a permissible error value is smaller than a measurement error range and thus the method of FIG. 5 cannot be used, the display panel 100 and the flexible printed circuit board 200 may be aligned by using a more precise alignment method described below with reference to FIG. 6.

First, referring to FIG. 6, a method for measuring distances between alignment marks disposed on the first region L will be described.

A horizontal distance PGL (i.e., a distance in the X-axis direction) between centers X1 and X2 of the pair of alignment marks PAML1 and PAML2 disposed in the pad region 125 of the display panel 100 is obtained.

In addition, a horizontal distance PFGL (i.e., a distance in the X-axis direction) between the center X1 of the first alignment mark PAML1 in the display panel 100 and a center X5 of the third alignment mark FAML in the flexible printed circuit board 200 is obtained.

The relative position of the third alignment mark FAML of the flexible printed circuit board 200 in the X-axis direction with reference to the pair of alignment marks PAML1 and PAML2 formed in the display panel 100 can be determined by using the two horizontal distances PGL and PFGL in the X-axis direction.

Similarly, in the second region R, the relative position of the third alignment mark FAMR of the flexible printed circuit board 200 in the X-axis direction with reference to the pair of alignment marks PAMR1 and PAMR2 is determined.

For example, a horizontal distance PGR (i.e., a distance in the X-axis direction) between centers X3 and C4 of the pair of alignment marks PAMR1 and PAMR2 disposed in the pad region 125 of the display panel 100 is obtained. In addition, a horizontal distance PFGR (i.e., a distance in the X-axis direction) between the center X3 of the first alignment mark PAMR1 in the display panel 100 and a center X6 of the third alignment mark FAMR in the flexible printed circuit board 200 is obtained. The relative position of the third alignment mark FAMR of the flexible printed circuit board 200 in the X-axis direction with reference to the pair of alignment marks PAMR1 and PAMR2 formed in the display panel 100 may be determined by using the two horizontal distances PGR and PFGR in the X-axis direction.

The relative positions of the third alignment marks FAML and FAMR of the flexible printed circuit board 200 may be matched to align the flexible printed circuit board 200 to the display panel 100 by moving the flexible printed circuit board 200.

For example, when the flexible printed circuit board 200 moves horizontally (i.e., the X-axis direction), the relative positions of the two third alignment marks FAML and FAMR of the flexible printed circuit board 200 are changed. The flexible printed circuit board 200 may be aligned to the display panel 200 when the horizontal distances PFGL and PFGR have substantially the same value and/or when the horizontal distances PGL and PGR have the same value.

In addition, since measurement errors may occur in the measured distances PGL, PFGL, PGR, and PFGR, a design value based upon the horizontal distance between the pair of alignment marks PAML1 and PAML2 disposed on the first region L and a design value based upon the horizontal distance between the pair of alignment marks PAMR1 and PAMR2 disposed on the second region R may be used to compensate for the measurement errors.

The compensation may be achieved by aligning the flexible printed circuit board 200 to the display panel 100 based on a value of Equation 1.

$$(X5-X1)/[(X2-X1)/(DV)] + (X3-X6)/[(X3-X4)/(DV)] = \text{Target Value(``TV'')} \quad \text{[Equation 1]}$$

Here, X1 and X3 denote the measured positions of the centers of the pair of first alignment marks PAML1 and PAMR1, X2 and X4 denote the measured positions of the centers of the pair of second alignment marks PAML2 and PAMR2, and X5 and X6 denote the measured positions of the centers of the third alignment marks FAML and FAMR. DV denotes the design value corresponding to a distance between the center of the first alignment mark and the center of the second alignment mark in the X-axis direction in each of the first and second regions L and R.

In Equation 1, $(X5-X1)/[(X2-X1)/(DV)]$ is calculated based on the first alignment mark PAML1 and second alignment mark PAML2 disposed in the first region L of the display panel 100, and the third alignment mark FAML disposed in the first region L of the flexible printed circuit board 200, and the design value corresponding to a distance between the first alignment mark PAML1 and the second alignment mark PAML2 in the X-axis direction.

In addition, in Equation 1, $(X3-X6)/[(X3-X4)/(DV)]$ is calculated based on the first alignment mark PAMR1, the second alignment mark PAMR2, the third alignment mark FAMR, and the design value. The design value may correspond to a distance between the first alignment mark PAMR1 and the second alignment mark PAMR2 in the X-axis direction.

Depending on embodiments, the design value between the first alignment mark PAML1 and the second alignment mark PAML2 and the design value between the first alignment mark PAMR1 and the second alignment mark PAMR2 may have different values or have the same value.

Here, $[(X2-X1)/(DV)]$ and $[(X3-X4)/(DV)]$ imply correction and/or compensation of the measured values (e.g., X2−X1 or X3−X4) based on the design value. For example, in case where the design value is 200 µm and the measured value is 100 µm, the denominator value becomes ½, and thus the measured value is corrected by increasing the entire (X5−X1)/[(X2−X1)/(DV)] and (X3−X6)/[(X3−X4)/(DV)] two times.

Figure 8:
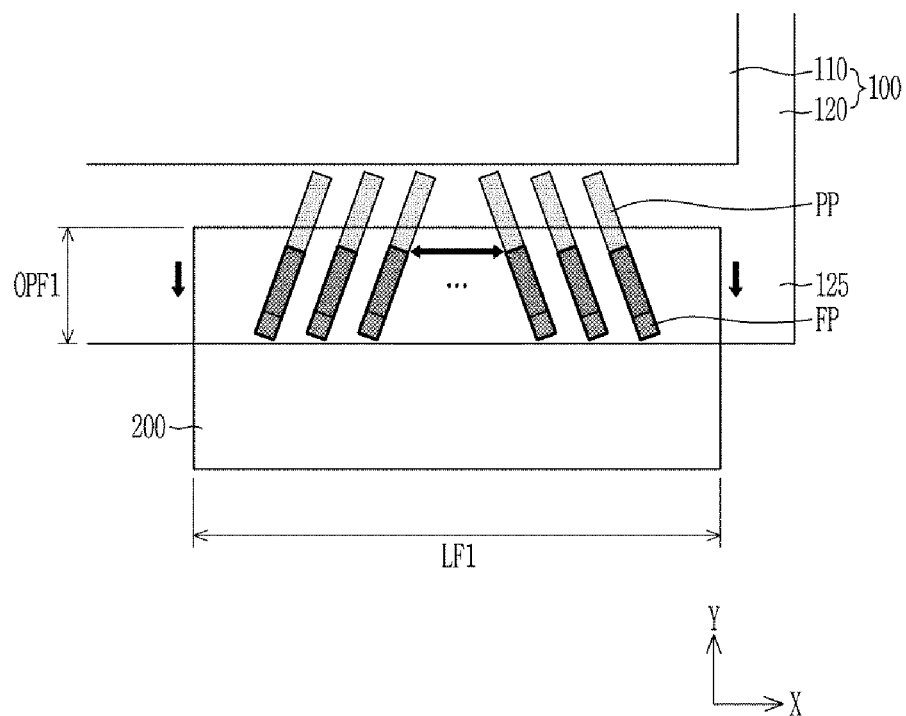
FIG. 8 and FIG. 9 are plan views of a part of an embodiment of a display device constructed according to the principles of the invention illustrating some of the manufacturing processes used to adjust the amount of overlap and attach the flexible printed circuit board on the display panel in the correct position.
Figure 9:
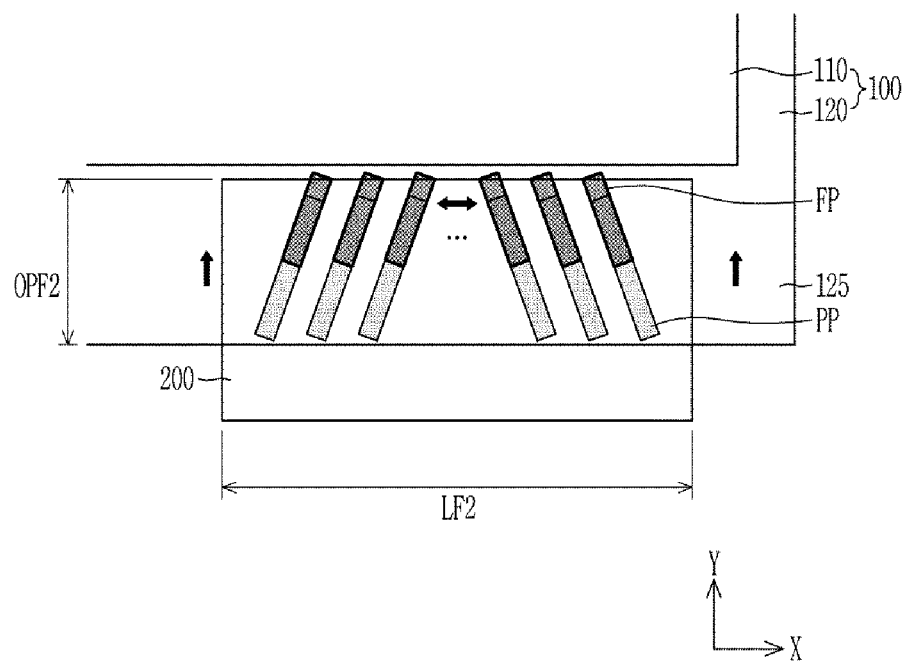

Equation 1, which adds the corrected left and right side values, may have a value of more than 0 and 30 µm or less, and may have a value in a range of more than 0 and 1 mm or less depending on the size of the display panel 100. Since a target value, which is the value of Equation 1 when the flexible printed circuit board 200 is aligned to the display panel 100, may be determined, the alignment marks PAML1, PAMR1, PAML2, PAMR2, FAML, and FAMR may be aligned by moving the flexible printed circuit board 200 in the X-axis and/or Y-axis direction based on the target value. More specifically, when the flexible printed circuit board 200 is aligned in the X-axis direction based on Equation 1, the target value may be determined for each specific display panel and/or display device, and thus the flexible printed circuit board 200 may be moved such that the value of Equation 1 becomes the target value to align the flexible printed circuit board 200 to the display panel 200. In addition, as shown in FIG. 8 and FIG. 9, to align the flexible printed circuit board in the Y-axis direction, a distance OPF1 where the display panel 100 and the flexible printed circuit board 200 overlap each other in the Y-axis direction may be adjusted depending on a gap between the pads FP of the flexible printed circuit board 200. This will be described in detail with reference to FIG. 8 and FIG. 9.

In Equation 1, values of X5−X1, X2−X1, X3−X6, and X3−X4 may range from several µm to hundreds of µm, and the design value may be in a range of about 5 µm to about 2000 µm.

According to the method described with reference to FIG. 6, the alignment mark disposed on the left and the alignment mark disposed on the right are measured separately, and thus there is a small error of the measured value because the actual distance to be measured is as small as several pin to several hundreds of µm.

In addition, depending on embodiments, Equation 1 may be modified as follows.

$$(X5-X1)/[(X2-X1)/(DV)]-(X3-X6)/[(X3-X4)/(DV)]= \text{Target Value("TV")} \quad \text{[Equation 2]}$$

Equation 2 may be calculated by subtracting a value calculated based on the alignment marks (i.e., the first alignment mark PAMR1, the second alignment mark PAMR2, and the third alignment mark FAMR) disposed on the second region R from a value calculated based on the alignment marks (i.e., the first alignment mark PAML1, the second alignment mark PAML2, and the third alignment mark FAML) disposed on the first region L. A target value, which is the value of Equation 2 when the flexible printed circuit board 200 is aligned to the display panel 100, may be determined for each specific display panel and/or display device, and the flexible printed circuit board 200 may be moved such that Equation 2 becomes the target value, such as 0, to align the flexible printed circuit board 200 to the display panel 200.

In addition, unlike Equation 2, the value calculated based on the alignment marks disposed on the first region L may be subtracted from the value calculated based on the alignment marks disposed on the second region R.

Hereinabove, the method of aligning the display panel 100 and the flexible printed circuit board 200 with reference to the horizontal distance in the X-axis direction has been described.

In a case where the pad disposed in the pad region 125 of the display panel 100 and the pad disposed in the flexible printed circuit board 200 have a structure that extends in the Y-axis direction that is perpendicular to the X-axis direction, the alignment may be carried out only in the X-axis direction before attaching the display panel 100 and the flexible printed circuit board 200 to each other.

Depending on embodiments, each pad may be inclined at a certain angle with reference to the Y-axis direction, and in this case, it is necessary to align the display panel 100 and the flexible printed circuit board 200 to each other in the Y-axis direction. In an embodiment, each pad has an angle of about 1 degree to about 15 degrees about the Y-axis direction.

Hereinafter, this will be described with reference to FIG. 7 to FIG. 9.

Figure 7:
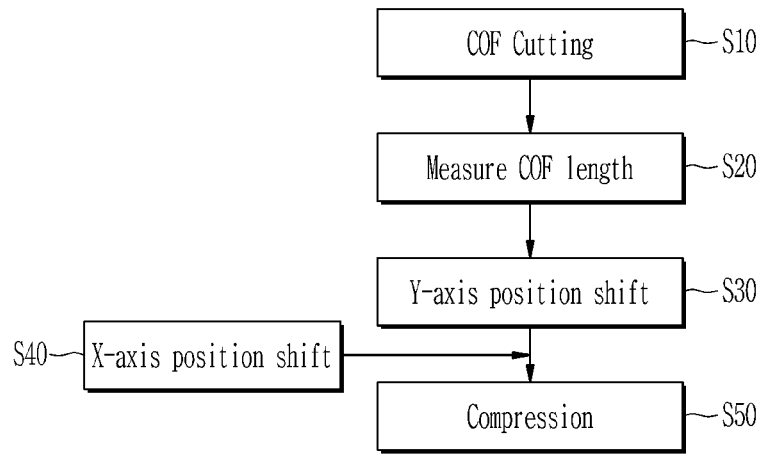
FIG. 7 is a flowchart of an embodiment of a method of forming, aligning, and attaching a flexible printed circuit board on a display panel according to the principles of the invention.

FIG. 7 is a flowchart of an embodiment of a method of forming, aligning, and attaching a flexible printed circuit board on a display panel according to the principles of the invention.

Referring to FIG. 7, alignment starts from cutting a flexible printed circuit board. That is, the flexible printed circuit board is formed in the form of a roll, a part of the roll is cut to form a single flexible printed circuit board 200, which may form a Chip On Film (COF), and then alignment and attachment are carried out therefrom. Therefore, COF cutting (S10) needs to be carried out so that the flexible printed circuit board 200 may include wires (or pads) to be used.

For example, in a case where a display device includes 24 flexible printed circuit boards 200 and its display panel includes 7680×4320 pixels, 24 flexible printed circuit boards 200 transmits data signals through 7680 data lines, and thus each flexible printed circuit board 200 needs to include at least 320 wires. Each flexible printed circuit board 200 is formed by cutting the entire roll to include the required number of wires.

Such a single flexible printed circuit board 200 may include the required number of wires, but the actual length may be different because the flexible printed circuit board 200 is formed in a plastic or polyimide (PI) substrate. Thus, COF length measuring (S20) is carried out to measure the entire length of the cut flexible printed circuit board 200 in the X-axis direction. In the COF length measuring (S20), a driving chip 250 may be attached to the flexible printed circuit board 200.

Based on the entire length in the X-axis direction, a gap between the wires in the X-axis direction may be predicted. For example, by dividing the entire length by the number of wires (or the number of pads) included, the gap between the wires (or pads) may be determined. The flexible printed circuit board 200 may be aligned to the display panel 100 in the Y-axis direction by moving the flexible printed circuit board 200 in the Y-axis direction based on the gap and/or the length in the X-axis direction (S30). As shown in FIG. 8 and FIG. 9, pads PP disposed in the display panel 100 and pads FP disposed in the flexible printed circuit board 200 may correspond to and overlap each other by moving the flexible printed circuit board 200 in the Y-axis direction. Also, the flexible printed circuit board 200 may be aligned to the display device 100 in the X-axis direction based on the alignment method described with reference to FIG. 6 (S40). Step S40 may be performed before or after step S30.

Then, compression (S50) is carried out after alignment along the X-axis and Y-axis directions is carried out such that the display panel 100 and the flexible printed circuit board 200 are electrically attached to each other.

Hereinafter, referring to FIG. 8 and FIG. 9, a method for aligning the pads PP of the display panel 100 and the pads FP of the flexible printed circuit board 200, while moving in the y-axis direction, will be described in more detail.

FIG. 8 and FIG. 9 are plan views of a part of an embodiment of a display device constructed according to the principles of the invention illustrating some of the manufacturing processes used to adjust the amount of overlap and attach the flexible printed circuit board on the display panel in the correct position.

Referring to FIG. 8 and FIG. 9, the pad PP of the display panel 100 and the pad FP of the flexible printed circuit board 200 are inclined at substantially the same angle about the Y-axis direction. Here, the inclined angle may be in the range of about 1 degree to about 15 degrees. In addition, the pads in the left and the pads in the right are formed to face each other with reference to the center of the flexible printed circuit board 200.

When the pads are formed at an inclined angle while facing each other, a gap between the pads FP that face each other in the flexible printed circuit board 200 (refer to the horizontal arrow in FIG. 8 and FIG. 9) is proportional to a horizontal length (i.e., a length in the X-axis direction) of the flexible printed circuit board 200.

As shown in FIG. 8, when a horizontal length LF1 of the flexible printed circuit board 200 is relatively long, the gap between the pads FP that face each other may be relatively wide. In this case, an overlapping distance OPF1 of the display panel 100 and the flexible printed circuit board 200 may decrease such that the pad PP of the display panel 100 and the pad FP of the flexible printed circuit board 200 may correspond to and/or overlap each other.

As shown in FIG. 9, the flexible printed circuit board 200 may have a horizontal length LF2 shorter than the horizontal length LF1 of FIG. 8, and accordingly the gap between the pads FP that face each other is decreased. In this case, an overlapping distance OPF2 of the display panel 100 and the flexible printed circuit board 200 may increase such that the pad PP of the display panel 100 and the pad FP of the flexible printed circuit board 200 may correspond to and/or overlap each other.

Hereinafter, various examples of the alignment mark will be described with reference to FIG. 10 and FIG. 11.

Figure 10:
FIG. 10 and FIG. 11 are plan views of embodiments of alignment marks for a flexible printed circuit board and a display panel.
Figure 10:
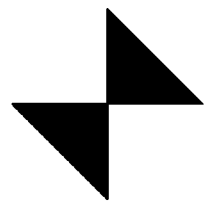
Figure 10:
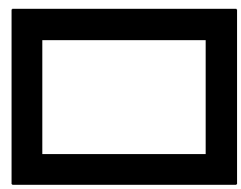
Figure 10:
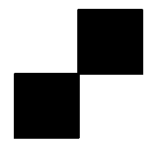
Figure 11:
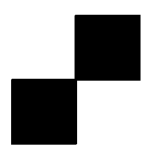
Figure 11:
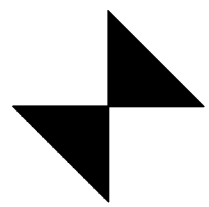
Figure 11:
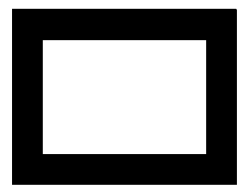
Figure 11:
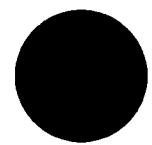

FIG. 10 and FIG. 11 are plan views of embodiments of alignment marks for a flexible printed circuit board and a display panel.

Referring to FIG. 10, alignment marks, which may be formed in the display panel 100, are illustrated.

In FIG. 10, (A) and (D) respectively show a pair of alignment marks shown in FIG. 3. The alignment mark may have a generally triangle shape in which vertices are connected to each other as shown in (B), and may have a generally quadrangle shape with a generally quadrangular shaped opening in the center as shown in (C).

FIG. 11 illustrates alignment marks, which may be formed in the flexible printed circuit board 200.

In FIG. 11, the alignment mark shown in FIG. 4 is not illustrated. In FIG. 11, (A) illustrates a generally quadrangular shape in which vertices are connected to each other, (B) illustrates a generally triangular shape in which vertices are connected to each other, (C) illustrates a generally quadrangular shape with a generally quadrangular shaped opening in the center, and (D) shows a circular shape.

The alignment marks with the above-stated various structures may be used, the alignment marks shown in FIG. 11 may be used in the display panel 100, and other alignment marks not illustrated in FIG. 10 and FIG. 11 may also be used.

Hereinafter, a machine to align and compress the display panel 100 and the flexible printed circuit board 200 will be described.

FIG. 12 is a view of an embodiment of an alignment and compression machine to attach a flexible printed circuit board to a display panel.

Referring to FIG. 12, an alignment and compression machine includes a pressing portion 10, and the pressing portion 10 may include a camera to recognize alignment marks of a pad area 125 of a display panel 100 and alignment marks of a flexible printed circuit board 200.

After determining the horizontal distance between the respective alignment marks by using the camera, the display panel 100 and the flexible printed circuit board 200 are aligned and then the flexible printed circuit board 200 is pressed to the display panel 100 using the pressing portion 10. In this case, an anisotropic conductive film (ACF) is provided between the flexible printed circuit board 200 and the display panel 100 such that the flexible printed circuit board 200 and the display panel 100 are electrically connected.

A plurality of pressing portions 10 may be formed in the alignment and compression machine such that a plurality of flexible printed circuit boards 200 can be simultaneously attached to the display panel 100.

The value of the distance between the alignment marks measured by each pressing portion 10 may have a relatively large error. In order to eliminate and/or reduce such a machine-specific error, as described with reference to FIG. 6, a relatively short distance between the alignment marks disposed on the left side is measured, a relatively short distance between the alignment marks disposed on the right side is measured, and alignment is performed by using the measured values which may have reduced errors. Accordingly, the alignment may be performed with a relatively high reliability.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
    a display panel including a display area and a non-display area;
    a flexible printed circuit board overlapping and attached to the display panel;
    a pair of first alignment indicia disposed in the non-display area;
    a pair of second alignment indicia adjacent to the first alignment indicia; and
    a pair of third alignment indicia disposed on the flexible printed circuit board,
    wherein the flexible printed circuit board is aligned to the display panel in the X-axis direction based on the following Equation 1:

$$(X5-X1)/(X2-X1)/(DV)] + (X3-X6)/[(X3-X4)/(DV)] = TV, \quad \text{[Equation 1]}$$

where X1 and X3 are positions of centers of the first alignment marks in the X-axis direction, respectively, X2 and X4 are positions of centers of the second alignment marks in the X-axis direction, respectively, X5 and X6 are positions of centers of the third alignment marks in the X-axis direction, respectively, DV is a design value of a distance between the center of one of the first alignment marks and the center of one of the second alignment marks in the X-axis direction in a region corresponding to each of the first and second sides, and TV is the target value to align the flexible printed circuit board to the display panel.

2. The display device of claim 1, wherein the each of the pairs of first, second and third indicia each comprise pairs of alignment marks, with one of the first alignment marks, one of the second alignment marks, and one of the third alignment marks are disposed adjacent to a first side of the flexible printed circuit board, and the other one of the first alignment marks, the other one of the second alignment marks, and the other one of the third alignment marks are disposed adjacent to a second side of the flexible printed circuit board opposing the first side.

3. The display device of claim 2, wherein each of the third alignment indicia is positioned between one of the first alignment indicia and one of the second alignment indicia in a first direction, and the first direction is the X-axis direction, and a distance between the pair of first alignment marks in the X-axis direction is longer than a distance between the pair of second alignment marks in the X-axis direction.

4. The display device of claim 3, wherein each of the third alignment marks is positioned between one of the first alignment marks and one of the second alignment marks in the X-axis direction in a region corresponding to each of the first and second sides.

5. The display device of claim 4, wherein each of the positions of the third alignment marks, the first alignment marks, and the second alignment marks is defined as a center of each alignment mark in the X-axis direction.

6. The display device of claim 3, wherein the second alignment marks are disposed in the non-display area, and the first alignment marks are positioned closer to one side of the display panel than the pair of second alignment marks, the one side of the display panel overlapping the flexible printed circuit board.

7. The display device of claim 6, wherein each of the positions of the first alignment marks and the second alignment marks is defined as a distance from the one side of the display panel in the Y-axis direction.

8. The display device of claim 3, wherein the display panel further comprises a plurality of first pads inclined to the Y-axis direction and facing each other, and the flexible printed circuit board further comprises a plurality of second pads inclined relative to the Y-axis direction and facing each other.

9. The display device of claim 8, wherein the plurality of first pads of the display panel and the plurality of second pads of the flexible printed circuit board are respectively inclined at an angle of about 1 degree to about 15 degrees with respect to the Y-axis direction.

10. The display device of claim 8, wherein a portion of the flexible printed circuit board overlapping the display panel has a first length in the Y-axis direction, the first length being determined depending on a second length of the flexible printed circuit board in the X-axis direction.

11. The display device of claim 2, wherein, in Equation 1, $(X5-X1)/[(X2-X1)/(DV)]$ is calculated with respect to one of the first alignment marks, one of the second alignment marks, and one of the third alignment marks, which are adjacent to the first side of the flexible printed circuit board, and $(X3-X6)/[(X3-X4)/(DV)]$ is calculated with respect to the other one of the first alignment marks, the other one of the second alignment marks, and the other one of the third alignment marks, which are adjacent to the second side of the flexible printed circuit board.

12. The display device of claim 11, wherein, in Equation 1, the design value is in a range of about 5 μm to about 2000 μm.

13. The display device of claim 1 wherein each of the pair of first alignment indicia, the pair of second alignment indicia, and the pair of third alignment indicia has a side parallel to an X-axis and another side parallel to a Y-axis perpendicular to the X-axis.

14. A method of manufacturing a display device having a display panel and a flexible printed circuit board, the display panel having a pair of first alignment marks and a pair of second alignment marks adjacent to the first alignment mark in a non-display area and the flexible printed circuit board having a pair of third alignment marks, the method comprising steps of:

aligning the flexible printed circuit board to the display panel in an X-axis direction based on the value of Equation 1:

$$(X5-X1)/[(X2-X1)/(DV)]+(X3-X6)/[(X3-X4)/(DV)]= TV, \quad \text{[Equation 1]}$$

where X1 and X3 are positions of centers of the first alignment marks in the X-axis direction, respectively, X2 and X4 are positions of centers of the second alignment marks in the X-axis direction, respectively, X5 and X6 are positions of centers of the third alignment marks in the X-axis direction, respectively, and DV is a design value of a distance between the center of one of the first alignment marks and the center of one of the second alignment marks in the X-axis direction in a region corresponding to each of the first and second sides, and TV is the target value to align the flexible printed circuit board to the display panel.

15. The method of claim 14, wherein, in Equation 1, $(X5-X1)/[(X2-X1)/(DV)]$ is calculated with respect to one of the first alignment marks, one of the second alignment marks, and one of the third alignment marks, which are adjacent to a left side of the flexible printed circuit board, and $(X3-X6)/[(X3-X4)/(DV)]$ is calculated with respect to the other one of the first alignment marks, the other one of the second alignment marks, and the other one of the third alignment marks, which are adjacent to a right side of the flexible printed circuit board.

16. The method of claim 15, wherein, in Equation 1, the design value is in a range of about 5 μm to about 2000 μm.

17. The method of claim 14, further comprising steps of:
measuring a first length of the flexible printed circuit board in the X-axis direction;
determining a second length of a portion of the flexible printed circuit board to overlap the display panel in a Y-axis direction that is generally perpendicular to the X-axis direction depending on the first length; and
aligning the flexible printed circuit board to the display panel in the Y-axis direction by moving the flexible printed circuit board in the Y-axis direction depending on the second length.

18. The method of claim 17, wherein the display panel further comprises a plurality of first pads inclined to the Y-axis direction and facing each other, and the flexible printed circuit board further comprises a plurality of second pads inclined relative to the Y-axis direction and facing each other.

19. The method of claim 18, wherein the plurality of first pads of the display panel and the plurality of second pads of the flexible printed circuit board are respectively inclined at an angle of about 1 degree to about 15 degrees with respect to the Y-axis direction.

20. The method of claim 17, further comprising the step of:

pressing the flexible printed circuit board and the display panel together after aligning the flexible printed circuit board to the display panel in the X-axis direction and the Y-axis direction.

* * * * *